United States Patent [19]

Ino et al.

[11] Patent Number: 5,452,309

[45] Date of Patent: Sep. 19, 1995

[54] APPARATUS AND METHOD FOR FORCING HARDWARE ERRORS VIA SCAN

[75] Inventors: David T. Ino, Santa Clara; Patricia A. Simonson, San Jose; Jeffrey A. Techau, Sunnyvale; Richard H. Larson, Los Gatos, all of Calif.

[73] Assignee: Amdahl Corporation, Sunnyvale, Calif.

[21] Appl. No.: 993,136

[22] Filed: Dec. 18, 1992

[51] Int. Cl.⁶ ............................................. G01R 31/28
[52] U.S. Cl. .................................. 371/22.3; 371/22.1
[58] Field of Search ................... 371/22.1, 22.3, 22.6, 371/15.1, 22.5, 23; 324/158 R

[56] References Cited

U.S. PATENT DOCUMENTS

| | | | |
|---|---|---|---|
| 4,937,826 | 6/1990 | Gheewala et al. | 371/22.1 |
| 4,972,144 | 11/1990 | Lyon et al. | 371/22.1 |
| 5,012,180 | 4/1991 | Dalrymple et al. | 371/22.1 X |
| 5,115,191 | 5/1992 | Yoshimori | 371/22.3 X |
| 5,260,649 | 11/1993 | Parker et al. | 371/22.3 X |
| 5,285,153 | 2/1994 | Ahanin et al. | 371/22.1 X |
| 5,303,246 | 4/1994 | Anderson et al. | 371/22.3 |

Primary Examiner—Emanuel T. Voeltz
Assistant Examiner—Edward Pipala
Attorney, Agent, or Firm—Fliesler, Dubb, Meyer & Lovejoy

[57] ABSTRACT

An apparatus and method for forcing stuck-at and transient errors at sequential and combinational logic and signal lines in a large scale data processing system. Error forcing is achieved by including a scan-in gate with error input and address lines for each scan point to be tested. A fault signal of adjustable duration is generated and combined in a unique fashion to an existing scan-in signal to permit either stuck-at or transient errors to be forced.

6 Claims, 6 Drawing Sheets

APPARATUS AND METHOD FOR FORCING HARDWARE ERRORS VIA SCAN

BACKGROUND OF THE INVENTION

1. Technical Field

The present invention relates to large scale data processing systems and, more specifically, to error servicing circuitry and control logic in a data processing machine.

2. Summary of Prior Art

In present day data processing systems, including high speed digital computers, a plurality of resources or functional units are provided to perform various functions. The functional units which generally comprise a data processing system are known in the art and are described in the overview presented with reference to FIG. 2. Approximately ⅓ of the hardware in such a system is dedicated to error detection and processing and is transparent to a user.

Data processing system design efforts have focused on increasing processing speed and the density of components. These efforts have been generally successful and emphasis in the industry is shifting towards accuracy and overcoming limitations induced by pin connections. With respect to accuracy, emphasis has been placed on the ability to not only detect and scan out an error, but also to scan-in or "force" an error. One well known scan out and scan-in procedure has been developed by Fujitsu Corporation and is referred to as Fujitsu scan.

Referring to FIG. 1, a scannable latch, generally according to Fujitsu scan, which includes functional and scan implementing components is shown. The specific combination of gates within the block indicated by dashed line 11 illustrates the functional latch component. The scan-in and scan out operations are provided by an addressable scan-in gate 12 and an addressable scan out gate 13, respectively. Other inputs to the functional latch 11 are a system clock, a data input and a clear. The functional latch 11 may be located in any of the functional units and at any location where a latch is so desired.

In order to test error servicing hardware, it is possible to force a certain logic state in the functional latch 11, which for a particular known condition would represent an error state. Error servicing logic then makes a determination as to whether an error detection device in communication with the functional latch 11 under test has generated an error signal in response to the error input by gate 12.

The functioning of scan-in gate 12 and scan out gate 13 are generally known in the art. Essentially, the scan-in gate 12 has two inputs: an error data signal and an address. The addressing scheme may utilize a three-dimensional matrix in which one dimension "z" is used to indicate a particular functional unit and the remaining two dimensions (x, y) create a matrix which is used to designate a particular location on a chip on the board containing the selected functional unit. Scan out gate 13 also has two inputs. The first is the output of functional gate 11 and the second is an address (the same as for scan-in gate 12). The output of functional latch 11 can, therefore, be scanned out by the application of an address for latch 11 at scan out gate 13.

In Fujitsu scan, the error data input is a scan clock signal which is a square wave having an active period, for example, of approximately 10 system clock cycles. A transient fault is simulated by addressing the desired latch and permitting the scan clock to be input to the scan-in input which is effectively the latch reset. This causes the latch to be reset at least every other 10 system clock cycles, the 10 cycle active period of the scanning clock simulating a transient error.

A significant limitation of the Fujitsu scan technique, however, is that it fails to permit a forcing of stuck-at faults, those faults which have an indefinite duration. A further disadvantageous limitation of the Fujitsu scan is that it is only applied to latches, and though latches represent an important part of testable circuitry, there are other portions of a data processing system that warrant testing, such as combinational logic, signal lines and other sequential logic. The Fujitsu scan does not provide these functions. Furthermore, due to the dense packaging of integrated circuits, there may not be sufficient die area to implement scan-in and scan out schemes for each of these additional scan points. Thus, there is a need to provide scannable access to locations other than latches and in a minimally intrusive manner that does not adversely compromise a high density of functional components.

SUMMARY OF THE INVENTION

Accordingly, it is an object of the present invention to provide error forcing at several points within a data processing system, those points including combinational logic gates, signal lines and sequential logic gates.

It is another object of the present invention to provide a forcing of both transient and stuck-at errors.

It is still another object of the present invention to provide an error forcing arrangement which accomplishes the above in a data processing system already incorporating scannable latches of the Fujitsu scan type.

And it is yet another object of the present invention to provide such an arrangement with a minimum of additional hardware.

These and related objects may be achieved through practice of the error forcing apparatus and method herein disclosed. An error forcing apparatus and method in accordance with the present invention generates both stuck-at and transient error forcing and is capable of delivering a generated error signal to combinational logic, sequential logic and to signal lines. Access to these scan points is achieved by including an additional scan-in gate with corresponding error input and address lines for each additional scan point that is desired to be tested. A stuck-at fault signal is generated and combined in a unique fashion to an existing scan-in clock signal to permit either stuck-at or transient errors to be forced. Whether a forced error is transient or stuck-at is a determination made by the user, though it may depend on the hardware being tested, and is implemented by error forcing control logic.

The present invention permits a thorough analysis of the error detecting and processing functions of a data processing system. As a result, the approximate ⅓ of overall data processing system circuitry dedicated to error processing can be thoroughly tested before shipment and during other periods such as diagnostics and recovery.

DETAILED DESCRIPTION

The present invention may be practiced in a plurality of environments but is particularly well suited for implementation in a data processing system. For that reason, such a data processing system is presented first to provide a context in which the present invention may be practiced. A description of the invention in such a system is provided thereafter.

Figure 2:
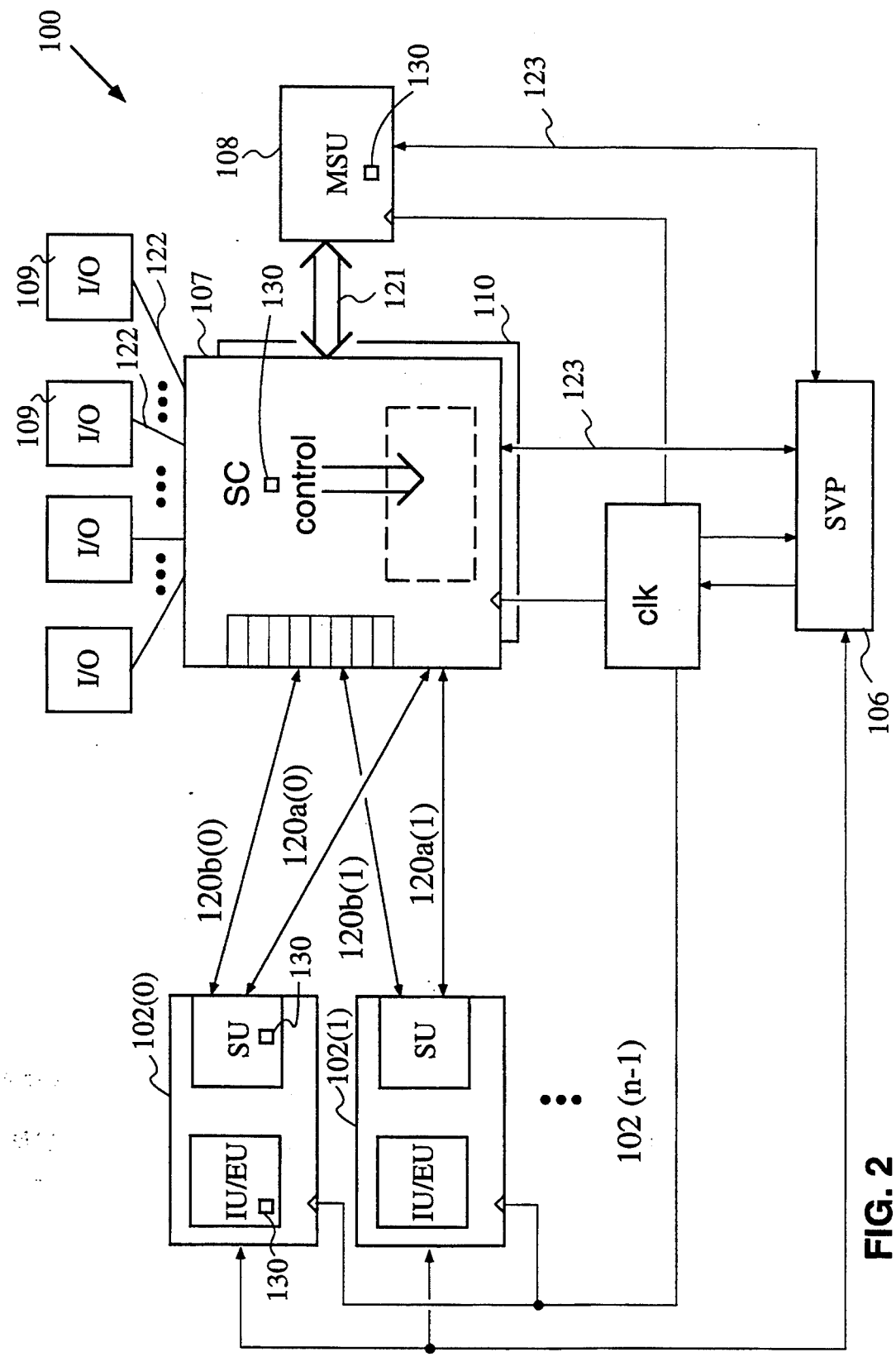
FIG. 2 is a block diagram of a data processing system.

Referring to FIG. 2, a multi-CPU computer system 100 is illustrated. The computer system 100 includes a plurality of central processing units 102 (0) to 102 (n-1), each having a storage unit 104 with a cache and an instruction unit 105. Each of the CPUs is coupled to a system control unit 107 across data lines 120a and control lines 120b. The data lines 120a (0) to 120a (n-1) transmit data to and from the system control unit 107 and the storage unit of each CPU 102. The control lines 120b transmit address, opcodes and controls between these two entities 107 and 102.

The system control unit 107 also includes an interface 121 to a main store unit 108. The system control unit 107 controls access to data among the CPUs and the main storage unit 108. Also coupled to the system control unit 107 through interface 122 are the input/output units 109. A service processor 106 is coupled to all of the functional units of the computer system 100 by scan interface 123, or otherwise as known in the art. The scan interface 123 provides access to data locations in the CPUs 102, main store unit 108 and system control unit 107 through a path independent of the normal operational path of the CPUs or system control units themselves. Thus, the service processor 106 is able to scan data indicating the state of the computer system out of the computer system without affecting the normal control path. Also, the service processor is able to write data into specific data locations within the functional units of the system using a scan-in technique described below.

Each of the functional units of the system 100 contains error detection devices 130 which are arranged throughout each unit. For clarity, these devices are designated by a small block 130 in each unit. In reality, however, the number of error detection devices may exceed 1,000 per unit. An error detected by one of these devices is bundled within its unit and propagated over interface 123 to the service processor 106 and to a system clock control unit (CCU) 129. The clock control unit 129 is shown isolated from other units, but may be located on one of the functional units such as the system control unit 107. In response to the reception of an error signal over interface 123, the clock control unit 129 disables the system clock and the service processor invokes a recovery algorithm. After processing the error, which includes logging error information and restoring the system to a proper state, the service processor sends a signal to the clock control circuit to restart the system clock.

Figure 3:
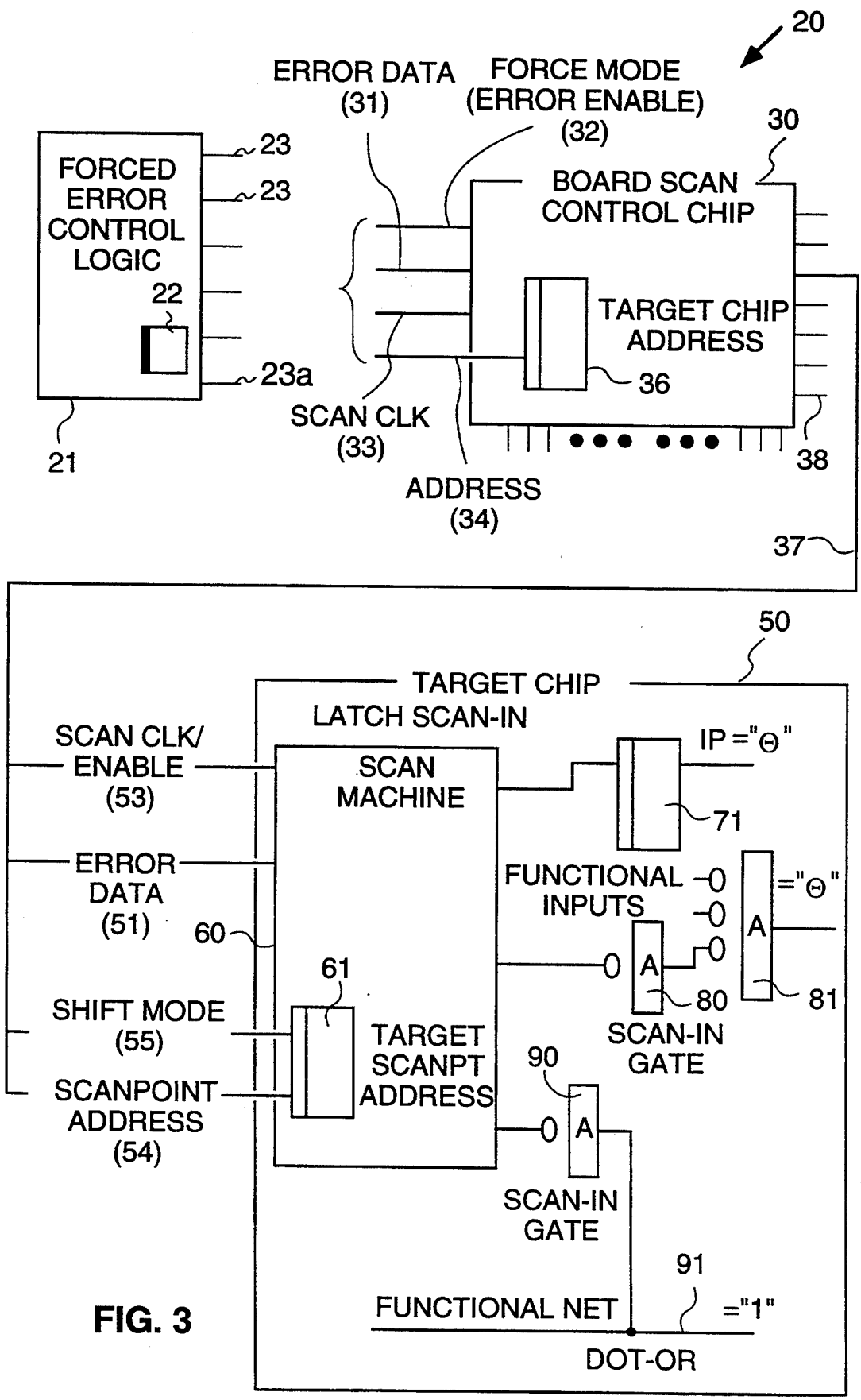
FIG. 3 is a block diagram of error forcing circuitry.

Referring to FIG. 3, a block diagram of error forcing circuitry is shown. The error forcing circuitry 20 includes a forced error control logic 21. The force error control logic 21 generates control, address, forced error data and synchronization signals. It is connected to a plurality of boards, each having one of said plurality of functional units located thereon. Each board contains a board scan control chip 30 which receives data from the forced error control logic 21 and disseminates this data to the appropriate chip on that board. The board scan control chip 30 is connected to each of the chips (of which only chip 50 is shown) on its' board and outputs addresses, synchronization and error data to each of the chips 50. Each chip has a scan machine 60 which receives and processes a scan address (54) and also receives error data (51) and a scan clock/enable signal (53). The output of the scan machine 60, which is in actuality a conceptual block and not necessarily a separate unit, routes the error data signal and two-dimensional address lines to a plurality of scannable points. This plurality of scannable points includes a scannable latch 71, much the same as scannable latch 11 of the prior art. Outputs from the scan machine 60 are also connected to a combinational scan-in gate 80 which has an output connected to an input of a functional combinational logic gate 81 for forcing an error in an output of gate 81. The scan machine 60 also routes error data (51) and the appropriate point address to a scan-in gate 90, having an output connected to a signal line 91.

It should be appreciated that the latch 71, combinational scan-in gate 80 and signal line scan-in gate 90 are each representative of a group of like structured components, for each chip may have hundreds or thousands of scannable points, and further that the invention is not limited to the configuration shown. For example, it is possible that one chip could have only scan-in latches, and that another chip could have only combinational scan-in gates, and further still that another chip may have only signal line scan-in gates. It is further possible that a chip might have 2 of the 3 types of scan-in gates or 3 of the 3 types of scan-in devices shown in FIG. 3. It is furthermore conceivable that the scan-in mechanism of FIG. 3 comprising an address line and an error data line may be utilized to test other points.

Referring now in more detail to FIG. 3, the forced error control logic 21 generates several signals, at least 4 of which are pertinent for purposes of the present invention. These signals are output to each of the functional units over individual groups of output lines 23 or over a bus (not shown). A first one of these signals, that is propagated over line 23a to the board scan control chip 30, is the force mode/error enable signal (32). The force mode/error enable signal (32) indicates, when active, that the data processing system is in forced error mode which means that the forced error control logic 21 is forcing an error at some scannable point within the system. A scan mode flag is set at register 22 and the output of register 22 is connected to the force mode/error enable signal (32).

A second signal is the error data signal (31) which may be used to force a transient or stuck-at error. A third signal is the scan clock signal (33) as provided in the Fujitsu scan of the prior art and used for, for example, synchronous resetting of a scannable latch. And a fourth signal, is an address line (34). Addressing may be done serially or in parallel, depending on the amount of available pin connections. When serial addressing is used, a serial shift signal is sent to the address decoder 36 which is, in this case, a plurality of latches that are decoded at their parallel output. With the serial shift signal enabled, the address is shifted in from the data in line by the scan clock. In a parallel addressing scheme, a sufficient number of address lines are provided and the address is shifted in by the scan clock.

The board scan control chip 30 includes a chip address decoder 36 to which is input the address signal 34. The chip address decoder 36 has an output connected over lines 38 to each of the plurality of chips on a particular board. In FIG. 3, a representative chip 50 of this plurality of chips is connected to the board scan control chip over line 37. The chip 50 and connecting line 37 provide an illustrative example of a layout and connection of one chip on a particular board, the specific layout of each board and the connections to chips on that board may vary in a manner known to those skilled in the art. The teaching of FIG. 3 is meant to be applied to different board layouts.

The initial 4 input lines to the board scan control chip 30 are modified in a manner discussed below and essentially 3 signals are propagated over line 37 to the chip 50. A first of these signals is the scan clock/enable (53). A second is the error data signal (51). A third is the address line which may include a serial shift mode signal (55) indicating a serial addressing mode or parallel address lines (54) for parallel address loading. Serial and parallel address loading is implemented as discussed immediately above, and is known in the art. The scan clock/enable signal (53) provides a synchronizing and enabling signal to the scan machine 60 permitting the scan point address decoder 61 to output an active address to the targeted scan-in component 70, 80 or 90, in synchronicity with the error data signal. The scan point address decoder 61 decodes the scan point address and generates an x and y coordinate for uniquely addressing each of the scan-in components 70, 80 and 90 which are arranged, from an addressing perspective, in a two-dimensional matrix. Having presented an overview of the error forcing system 20, a more detailed description of relevant board scan control chip 30 and chip 50 circuitry is now presented.

Figure 4:
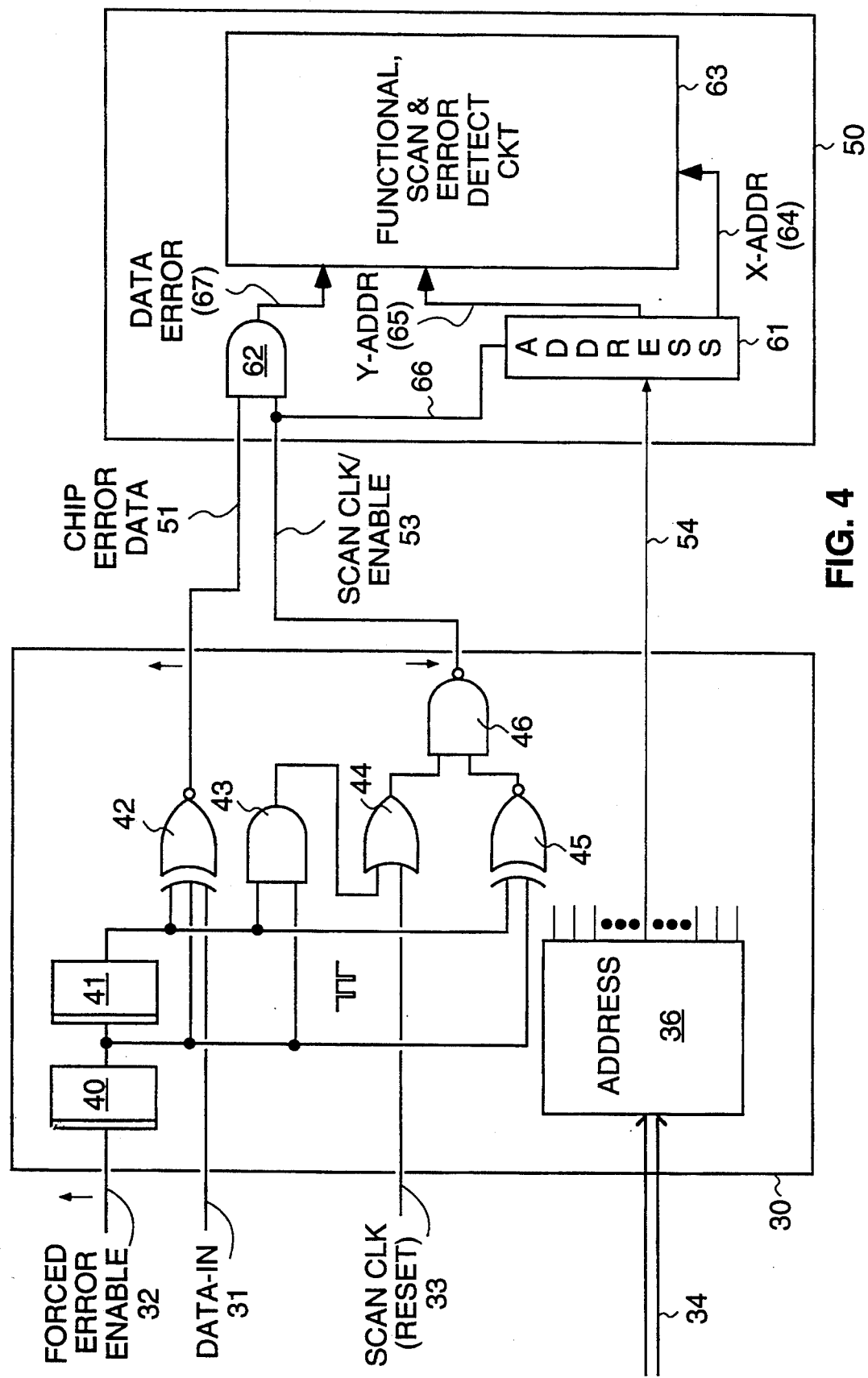
FIG. 4 is a schematic/block diagram of error forcing circuitry in a board scan control chip and a target chip in a best mode of carrying out the invention.

Referring to FIG. 4, a partial schematic view of the board scan control chip 30 and a target chip 50 is shown. Synchronous operation is used as a general rule in large data processing machines and synchronism is provided in scan-in and scan-out operations, as mentioned above and as known in the art, by the scan clock signal 33. The present invention, however, provides the ability to asynchronously induces error in such a synchronous operation, thereby permitting more comprehensive and realistic testing. This is carried out in part by the following hardware.

The error enable 32 is propagated to two delay elements or latches 40 and 41. The output of latch 40 is connected to NOR gate 42, AND gate 43 and exclusive-NOR (EXNOR) gate 45. The output of latch 41 is connected to these same gates. The data-in line 31 which provides serial address data and may also provide forced error data, although the gating structure of NOR gate 42 utilizes the force error enable as a source of error data, is connected to NOR gate 42. The output of this NOR gate 42 forms the error data-in (serial address data-in) line 51. The scan clock line 33 is input to an OR gate 44 which passes the scan clock through to NAND gate 46, except when the forced error enable, active high, is present at the outputs of both latches 40 and 41 in which case a steady high signal is output. The output of NAND gate 46 forms the error enable signal 53. The EXNOR gate 45 functions to enable NAND gate 46 other than during set up period A and removal period B (of FIG. 5).

The appropriate target point address signals are also propagated, over line 55/54, which represent either the serial or parallel transmission of address data to the target chip 50.

Figure 5:
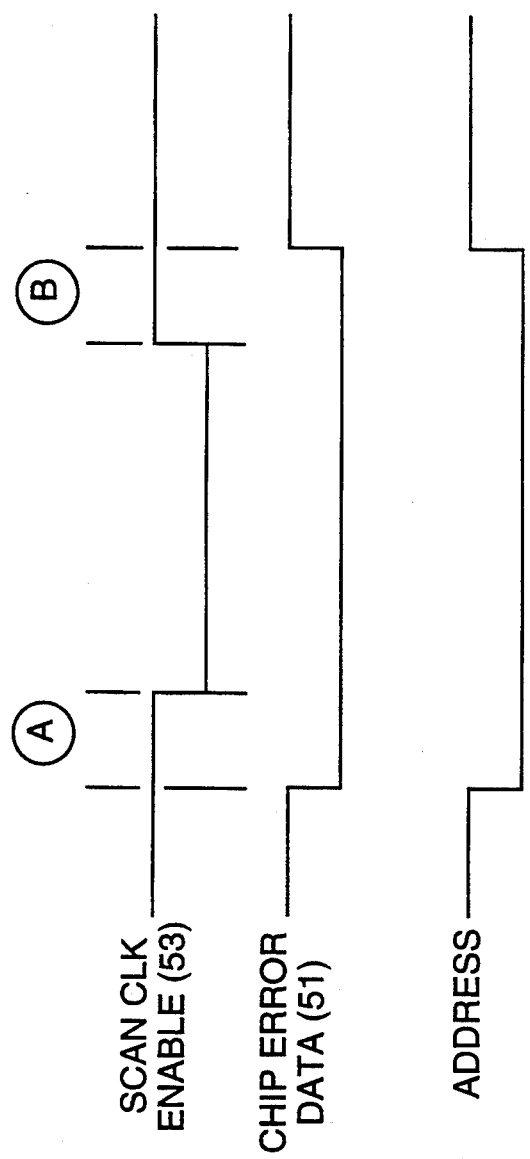
FIG. 5 timing diagram illustrating the relationship in time between forced error data and an error enable signal.

Referring to FIG. 5, a timing diagram illustrating the timing relationship between lines 51, 53 and 55/54 (all active low at the chip level) is shown. It is desirable that the error data and the desired scan point address are present before the error enable is transmitted and that they remain there after the error enable has been removed. EXNOR gate 45 disables the enable for one cycle when the latches 40 and 41 have different outputs (at the issuance and removal of the error enable) to provide such a function.

Upon input to the target chip 50, the error data signal (51) and the enable signal (53) are combined at AND gate 62. The enable signal (53) is also input to the target chip address decoder 61 to gate through a desired address to the functional scan and error detecting circuitry 63. The output of AND gate 62 is the error data signal 67 which is either transient or stuck-at depending on a particular forced error implementation. A y-address 65 and an x-address 64 are also provided to the functional, scan and error detecting circuitry 63.

Figure 1:
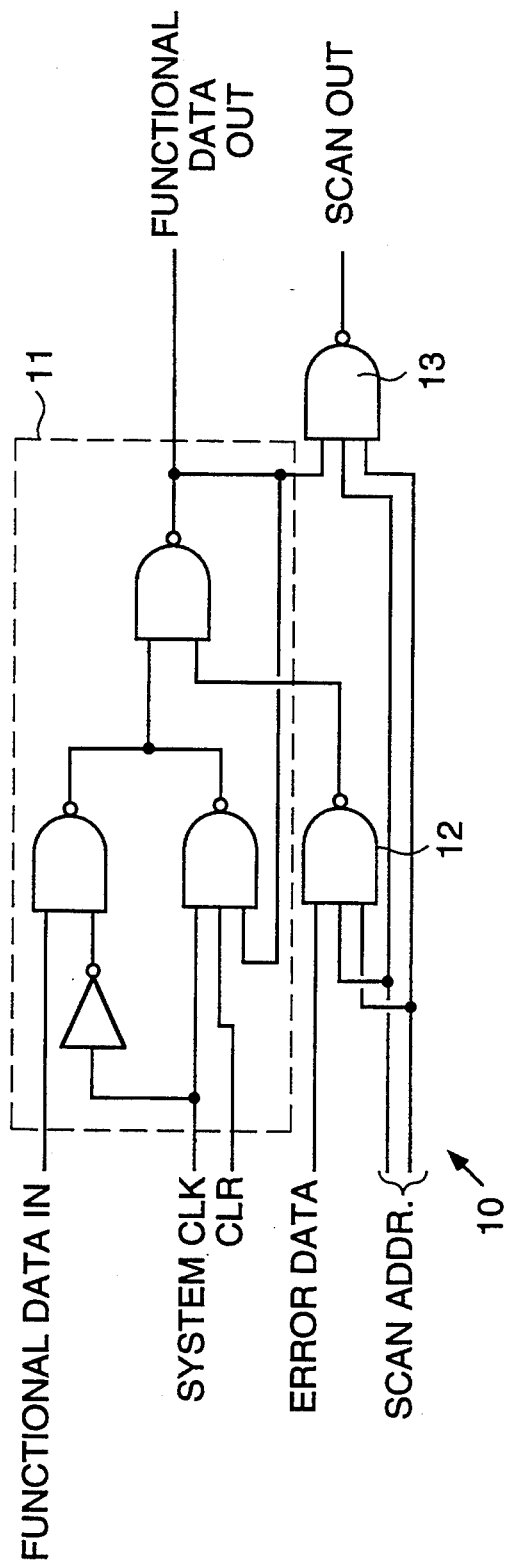
FIG. 1 is a schematic view of a scannable latch of the prior art.
Figure 6:
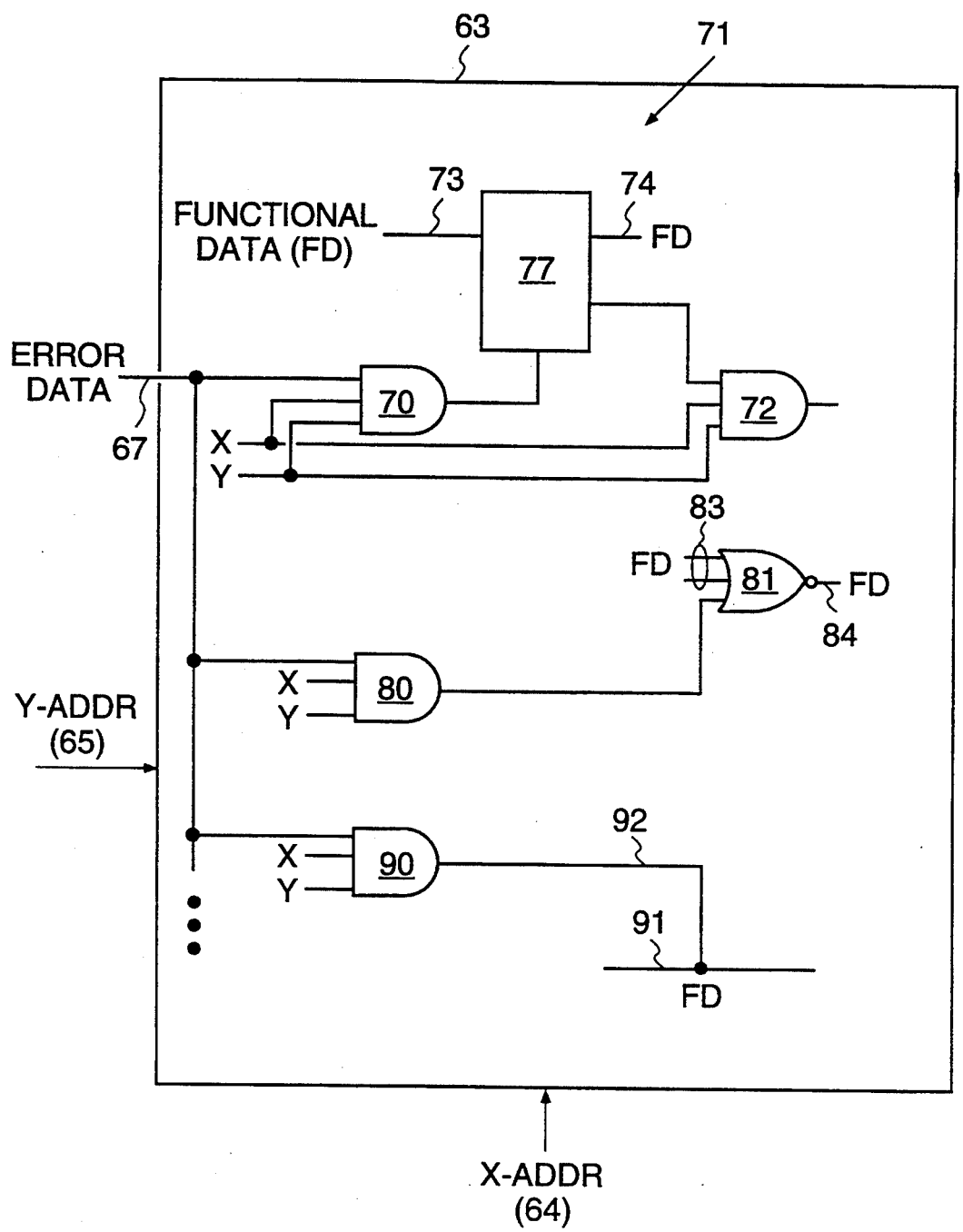
FIG. 6 is a schematic diagram of error forcing circuitry in a target chip.

Referring to FIG. 6, a more detailed schematic diagram of functional and scan related circuitry in a target chip is shown. The error data signal 67 is input to each of a plurality of scan-in gates 70, 80 and 90. These gates are analogous to the gates shown in FIG. 3, and like the gates in FIG. 3 are merely representative of an implementation of the comprehensive scan-in technique of the present invention. The scan-in gate 70 is similar to the scan-in gate 12 of the prior art. A significant difference in the present invention, however, is that the error data signal 67 is capable of being held for any desired duration. The functional latch 77 may be the same as functional latch 11 (of FIG. 1).

The combinational scan-in gate 80 is used to create transient and stuck-at errors in a combinational logic gate such as NOR gate 81. To implement such an arrangement, sufficient die area must be allocated to accommodate the combinational logic scan-in gate 80 and its' input lines. The x and y address are input to the gate 80 in addition to the error data signal 67. In the embodiment of FIG. 6, gate 80 is capable of inducing a logic high input to NOR gate 81, resulting in a logic low level on output line 84. If it is desired to have another logic level on output line 84, a different combination of AND, NAND, OR and NOR gates can be used. Input lines 83 represent functional inputs to the NOR gate 81.

Each of the signal line scan-in gates, represented here by individual gate 90, receives an x and y address and the error data signal 67. When each of these signals is in the appropriate logic state, high, in the embodiment of FIG. 6, line 92 assumes a logic high state pulling high signal line 91. In the instance when it is desired to test error detection equipment on line 91, a test signal may be applied to line 91 in a logic low state and then the output of gate 90 driven to a logic high state, pulling signal line 91 high. The error detection device for signal line 91 is then scanned out to see if an error signal has been generated.

Having discussed the hardware which permits the forcing of transient and stuck-at hardware errors, a discussion of possible test procedures is now presented. To test transient errors in a latch, it is possible to use the scan-in signal of the prior art as it was used in the prior art. Another method is to turn off all system clocks, set the error data signal 67 to the desired logic state, select the appropriate x and y addresses, and then turn the system clock on for one cycle. The appropriate scan points can then be scanned out to determine if the associated error detection devices have latched the error. It may in fact be necessary to turn the system clock on for one or two additional cycles to permit error detection and latching. This method of turning off the system clock setting an appropriate error condition and then turning the system clock on for one cycle may also be used to test transient errors on signal lines and in combinational logic gates.

Stuck-at errors may be implemented by simply selecting the error data signal 31 to be of a desired duration and then enabling the force mode/enable signal and sending desired address signal.

Thus, by using the hardware error forcing system described above, it is possible to achieve a number of desired ends not obtainable in the prior art. This includes, for example, the ability to analyze one bit on a bus, or a non-latchable point in a state machine, etc. It permits both transient and stuck-at error forcing wherever it is desirable to have a scan point, such as at interfaces which receive a high volume of data propagation. It, furthermore, permits utilization of an existing scan system and improves thereon to provide comprehensive testing in such a manner that does not add significant extra logic. Thus, the present invention provides a low cost means for comprehensively testing the approximately ⅓ of a data processing system dedicated to error detection and processing that had previously not been tested.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. In a data processing system, having a plurality of data locations through which data is propagated during system clock cycles in response to a system clock signal, where a plurality of said data locations are not accessable by I/O pins, and a plurality of scannable latch means, each associated with one of said plurality of data locations and having a scan-in input and an address input, an apparatus for forcing errors, comprising:
   a plurality of non-latchable scannable points, each having a scan-in input and an address input;
   means for generating an error forcing signal, having a predetermined logic state and representing a duration of an error, said duration ranging from transient to stuck-at;
   means for generating a unique address for each of said plurality of scannable latch means and non-latchable points;
   means for simultaneously communicating said error forcing signal to the scan-in input of one of said plurality of scannable latch means and said non-latchable points with a unique address for that one of said plurality of scannable latch means and non-latchable points; and wherein
   input of said error forcing signal to said scan-in input of said one of said plurality of scannable latch means and non-latchable points creates a predetermined logic state in said one of said plurality of scannable latch means and non-latchable points for at least said duration.

2. The apparatus of claim 1, wherein one of said scannable non-latchable points is a scannable combinational logic gate.

3. The apparatus of claim 1, wherein one of said scannable non-latchable points is a scannable signal line.

4. The apparatus of claim 1, further comprises:
   means for generating an asynchronous error enable signal to each of said plurality of scannable points; and
   enable combining means for combining said asynchronous error enable signal with a signal for providing synchronous scan operation, in such a manner that said asynchronous error enable signal overrides said synchronous scan operation signal.

5. The apparatus of claim 4, further comprises:
   error data combining means for combining a data-in signal and said error enabling signal before input to a scannable point.

6. The apparatus of claim 4, wherein said data-in signal is present at said error data combining means before said error forcing signal is present and is removed after said error forcing signal is removed.

* * * * *